(12) United States Patent
Ho et al.

(10) Patent No.: US 12,283,329 B2
(45) Date of Patent: Apr. 22, 2025

(54) ELECTRONIC FUSE CIRCUIT AND METHOD FOR ELECTRONIC FUSE CIRCUIT

(71) Applicant: United Microelectronics Corp., Hsinchu (TW)

(72) Inventors: Chia Wei Ho, Nantou County (TW); Min Chia Wang, New Taipei (TW); Chung Ming Lin, Hsinchu (TW); Jin Pang Chi, Taipei (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 18/306,221

(22) Filed: Apr. 24, 2023

(65) Prior Publication Data

US 2023/0260585 A1  Aug. 17, 2023

Related U.S. Application Data

(62) Division of application No. 17/224,692, filed on Apr. 7, 2021, now Pat. No. 11,694,756.

(30) Foreign Application Priority Data

Feb. 2, 2021 (TW) ................................. 110103818

(51) Int. Cl.
  *G11C 17/18* (2006.01)
  *G11C 17/16* (2006.01)
  *H03K 17/687* (2006.01)

(52) U.S. Cl.
  CPC .............. *G11C 17/18* (2013.01); *G11C 17/16* (2013.01); *H03K 17/6871* (2013.01)

(58) Field of Classification Search
  CPC ....................................................... G11C 17/18
  See application file for complete search history.

(56) References Cited

U.S. PATENT DOCUMENTS

| 5,345,110 A | 9/1994 | Renfro et al. |
| RE36,952 E | 11/2000 | Zagar et al. |

(Continued)

FOREIGN PATENT DOCUMENTS

| CN | 1289445 | 3/2001 |
| CN | 111899772 | 11/2020 |

OTHER PUBLICATIONS

"Office Action of Taiwan Counterpart Application", issued on Jan. 31, 2024, p. 1-p .8.

*Primary Examiner* — Douglas King
(74) *Attorney, Agent, or Firm* — JCIPRNET (57) ABSTRACT

A power circuit is adapted for providing a programming voltage to an electronic fuse circuit, and includes a pass transistor of a P-type metal-oxide-semiconductor transistor, a buffer circuit, and a bulk voltage control circuit. The pass transistor includes a bulk electrode, a gate electrode, a first source/drain electrode receiving a system high voltage, and a second source/drain electrode connected to a bit line. The buffer circuit provides a control voltage to the gate electrode of the pass transistor. The pass transistor is turned on during a programming operation and turned off during a reading operation. The bulk voltage control circuit independently provides a bulk voltage to the bulk electrode. A last-stage buffer of the buffer circuit is also activated by the bulk voltage to control the pass transistor during the reading operation of the electronic fuse circuit. A method for providing power to an electronic fuse circuit is also provided.

17 Claims, 6 Drawing Sheets

(56) References Cited

U.S. PATENT DOCUMENTS

| | | |
|---|---|---|
| 7,911,820 B2 | 3/2011 | Anand et al. |
| 2007/0002640 A1 | 1/2007 | Byeon |
| 2008/0175068 A1 | 7/2008 | Houston et al. |
| 2012/0320700 A1 | 12/2012 | Lin et al. |
| 2013/0015991 A1 | 1/2013 | Cheeranthodi |
| 2015/0116042 A1 | 4/2015 | Km et al. |
| 2022/0103170 A1* | 3/2022 | Liberti ............... H03K 17/567 |

* cited by examiner

ELECTRONIC FUSE CIRCUIT AND METHOD FOR ELECTRONIC FUSE CIRCUIT

CROSS-REFERENCE TO RELATED APPLICATION

This application is a divisional application of and claims the priority benefit of U.S. application Ser. No. 17/224,692, filed on Apr. 7, 2021, which claims the priority benefit of Taiwan application no. 110103818, filed on Feb. 2, 2021. The entirety of each of the above-mentioned patent applications is hereby incorporated by reference herein and made a part of this specification.

BACKGROUND

Technical Field

The disclosure relates to a semiconductor manufacturing technology; particularly the disclosure relates to an electronic fuse circuit used in a memory device.

Description of Related Art

Semiconductor memory devices have been widely applied to storage of digital data and program codes required for operating electronic products. The memory devices include a large number of memory cells. After manufacture or use, some of the memory cells may be damaged, and data stored therein may thus be lost. Fuses in electronic fuse (eFuse) circuits may serve for modification of the data.

In the manufacture of integrated circuits, programs in the integrated circuits may be dynamically re-modified in real time with the electronic fuse circuits. Briefly speaking, the programs in the integrated circuits have been etched into the integrated circuits during manufacture in the factory, and cannot be further modified after the integrated circuit are shipped out of the factory. However, through electronic fuse technology, integrated circuit manufacturers can adjust a circuit in the integrated circuits during its operation.

Design of the electronic fuse circuit involves a programming path and a read path, and a metal-oxide-semiconductor (MOS) transistor adopted as a switch on the programming path and the read path for a programming operation or a reading operation. In general, the electronic fuse circuit includes a plurality of electronic fuse units that write or read data on the selected electronic fuse units under control by the programming path or the read path.

The electronic fuse circuit may have a variety of designs, and factors that require to be considered in the design include an occupied device area and data reading accuracy.

SUMMARY

The disclosure provides a power circuit, an electronic fuse circuit, and a method for providing power to an electronic fuse circuit. A plurality of electronic fuse units may adopt a shared one transistor (1T) design, saving a device area. In the disclosure, the provided power circuit, under the 1T architecture, also reduces a leakage of a transistor at the same time, ensuring reading accuracy.

The disclosure provides a power circuit, adapted for providing a programming voltage to an electronic fuse circuit. The power circuit includes a pass transistor of a P-type metal-oxide-semiconductor (PMOS) transistor, a buffer circuit, and a bulk voltage control circuit. The pass transistor includes a bulk electrode, a gate electrode, a first source/drain electrode receiving a system high voltage, and a second source/drain electrode connected to a bit line. The buffer circuit provides a control voltage to the gate electrode of the pass transistor. The pass transistor is turned on during a programming operation and turned off during a reading operation. The bulk voltage control circuit independently provides a bulk voltage to the bulk electrode. A last-stage buffer of the buffer circuit is also activated by the bulk voltage to control the pass transistor during the reading operation of the electronic fuse circuit.

In an embodiment, regarding the power circuit, the bulk voltage control circuit receives an operation voltage and the system high voltage for the pass transistor, to ensure that the bulk voltage is the operation voltage, or that the bulk voltage is the system high voltage when the system high voltage is higher than the operation voltage.

In an embodiment, regarding the power circuit, the bulk voltage control circuit includes a first PMOS transistor, a second PMOS transistor, a first resistor, and a second resistor. The first PMOS transistor includes a first source electrode connected to the operation voltage, a first drain electrode connected to an output node, and a first gate electrode. The second PMOS transistor includes a second source electrode connected to the system high voltage, a second drain electrode connected to the output node for providing the bulk voltage, and a second gate electrode. The first resistor is connected between the operation voltage and the second gate electrode. The second resistor is connected between the system high voltage and the first gate electrode.

In an embodiment, regarding the power circuit, the bulk voltage control circuit includes a first PMOS transistor and a second PMOS transistor. The first PMOS transistor includes a first source electrode connected to the operation voltage, a first drain electrode connected to an output node, and a first gate electrode. The second PMOS transistor includes a second source electrode connected to the system high voltage, a second drain electrode connected to the output node for providing the bulk voltage, and a second gate electrode. The first gate electrode is directly connected to the system high voltage. The second gate electrode is directly connected to the operation voltage.

In an embodiment, regarding the power circuit, the bulk voltage of the bulk voltage control circuit is the operation voltage when the system high voltage is changed into a low voltage or a floating voltage. In addition, the bulk voltage of the bulk voltage control circuit is the system high voltage when the system high voltage is higher than the operation voltage.

In an embodiment, regarding the power circuit, the buffer circuit includes a front-stage buffer and the last-stage buffer. The front-stage buffer is under control by the system high voltage and the last-stage buffer is under control by the bulk voltage, and an output terminal of the front-stage buffer is connected to an input terminal of the last-stage buffer.

In an embodiment, regarding the power circuit, the front-stage buffer and the last-stage buffer are inverters.

In an embodiment, the disclosure also provides an electronic fuse circuit. The electronic fuse circuit includes a read path transistor, which includes a source electrode to receive an operation voltage, a gate electrode under control by a read enable signal, and a drain electrode. In addition, the electronic fuse circuit also includes an electronic fuse array that includes a plurality of electronic fuse units, each of which is commonly connected to the drain electrode of the read path transistor. The electronic fuse circuit also includes a power circuit, which is connected to the drain electrode of the read path transistor. The power circuit includes a pass transistor of a P-type metal-oxide-semiconductor (PMOS) transistor, a buffer circuit, and a bulk voltage control circuit. The pass transistor includes a bulk electrode, a gate electrode, a first source/drain electrode receiving a system high voltage, and a second source/drain electrode connected to a bit line. The buffer circuit provides a control voltage to the gate electrode of the pass transistor. The pass transistor is turned on during a programming operation and turned off during a reading operation. The bulk voltage control circuit independently provides a bulk voltage to the bulk electrode. A last-stage buffer of the buffer circuit is also activated by the bulk voltage to control the pass transistor during the reading operation of the electronic fuse circuit.

In an embodiment, regarding the electronic fuse circuit, the bulk voltage control circuit receives the operation voltage and the system high voltage for the pass transistor, to ensure that the bulk voltage is the operation voltage, or that the bulk voltage is the system high voltage when the system high voltage is higher than the operation voltage.

In an embodiment, regarding the electronic fuse circuit, the bulk voltage control circuit includes a first PMOS transistor, a second PMOS transistor, a first resistor, and a second resistor. The first PMOS transistor includes a first source electrode connected to the operation voltage, a first drain electrode connected to an output node, and a first gate electrode. The second PMOS transistor includes a second source electrode connected to the system high voltage, a second drain electrode connected to the output node for providing the bulk voltage, and a second gate electrode. The first resistor is connected between the operation voltage and the second gate electrode. The second resistor is connected between the system high voltage and the first gate electrode.

In an embodiment, regarding the electronic fuse circuit, the bulk voltage control circuit includes a first PMOS transistor and a second PMOS transistor. The first PMOS transistor includes a first source electrode connected to the operation voltage, a first drain electrode connected to an output node, and a first gate electrode. The second PMOS transistor includes a second source electrode connected to the system high voltage, a second drain electrode connected to the output node for providing the bulk voltage, and a second gate electrode. The first gate electrode is directly connected to the system high voltage. The second gate electrode is directly connected to the operation voltage.

In an embodiment, regarding the electronic fuse circuit, the bulk voltage of the bulk voltage control circuit is the operation voltage when the system high voltage is changed into a low voltage or a floating voltage. In addition, the bulk voltage of the bulk voltage control circuit is the system high voltage when the system high voltage is higher than the operation voltage.

In an embodiment, regarding the electronic fuse circuit, the buffer circuit includes a front-stage buffer and the last-stage buffer. The front-stage buffer is under control by the system high voltage and the last-stage buffer is under control by the bulk voltage, and an output terminal of the front-stage buffer is connected to an input terminal of the last-stage buffer.

In an embodiment, regarding the electronic fuse circuit, the front-stage buffer and the last-stage buffer are inverters.

In an embodiment, regarding the electronic fuse circuit, each electronic fuse unit includes: a fuse device connected to the drain electrode of the read path transistor; and a read device connected between the fuse device and the ground voltage. The read device is connected to or disconnected from the ground voltage according to the control.

In an embodiment, regarding the electronic fuse circuit, the read path transistor and the pass transistor in the power circuit are turned on to respectively correspond to the reading operation and the programming operation.

In an embodiment, the disclosure also provides a method for providing power to an electronic fuse circuit, including providing a pass transistor of a PMOS transistor that includes a bulk electrode, a gate electrode, a first source/drain electrode receiving a system high voltage, and a second source/drain electrode connected to a bit line. The method further includes providing a buffer circuit to provide a control voltage to the gate electrode of the pass transistor, where the pass transistor is turned on during a programming operation and turned off during a reading operation. This method also includes providing a bulk voltage control circuit to independently provide a bulk voltage to the bulk electrode. A last-stage buffer of the buffer circuit is also activated by the bulk voltage to control the pass transistor during the reading operation of the electronic fuse circuit.

In an embodiment, regarding the method, the bulk voltage control circuit as provided receives the operation voltage and the system high voltage for the pass transistor, to ensure that the bulk voltage is the operation voltage, or that the bulk voltage is the system high voltage when the system high voltage is higher than the operation voltage.

In an embodiment, regarding the method, the bulk voltage control circuit as provided includes a first PMOS transistor, a second PMOS transistor, a first resistor, and a second resistor. The first PMOS transistor includes a first source electrode connected to the operation voltage, a first drain electrode connected to an output node, and a first gate electrode. The second PMOS transistor includes a second source electrode connected to the system high voltage, a second drain electrode connected to the output node for providing the bulk voltage, and a second gate electrode. The first resistor is connected between the operation voltage and the second gate electrode. The second resistor is connected between the system high voltage and the first gate electrode.

In an embodiment, regarding the method, the bulk voltage control circuit as provided includes a first PMOS transistor and a second PMOS transistor. The first PMOS transistor includes a first source electrode connected to the operation voltage, a first drain electrode connected to an output node, and a first gate electrode. The second PMOS transistor includes a second source electrode connected to the system high voltage, a second drain electrode connected to the output node for providing the bulk voltage, and a second gate electrode. The first gate electrode is directly connected to the system high voltage. The second gate electrode is directly connected to the operation voltage.

In an embodiment, regarding the method, the bulk voltage of the bulk voltage control circuit is the operation voltage when the system high voltage is changed into a low voltage or a floating voltage. In addition, the bulk voltage of the bulk voltage control circuit is the system high voltage when the system high voltage is higher than the operation voltage.

In an embodiment, regarding the method, the buffer circuit as provided includes a front-stage buffer and the last-stage buffer. The front-stage buffer is under control by the system high voltage and the last-stage buffer is under control by the bulk voltage, and an output terminal of the front-stage buffer is connected to an input terminal of the last-stage buffer.

In an embodiment, regarding the method, the front-stage buffer and the last-stage buffer are inverters.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

The disclosure provides a power circuit, which may be disposed in an electronic fuse circuit and provides power to the electronic fuse circuit. A plurality of electronic fuse units of the electronic fuse circuit may adopt a shared single transistor (1T) design, saving a device area. In the disclosure, the provided power circuit, under the 1T architecture, also reduces a leakage of a transistor at the same time to ensure reading accuracy.

Hereinafter, some embodiments are provided to explain a look into an electronic fuse circuit of the disclosure, and design embodiments of the electronic fuse circuit are further proposed. In addition, the disclosure is also not limited to the embodiments provided.

Figure 1:
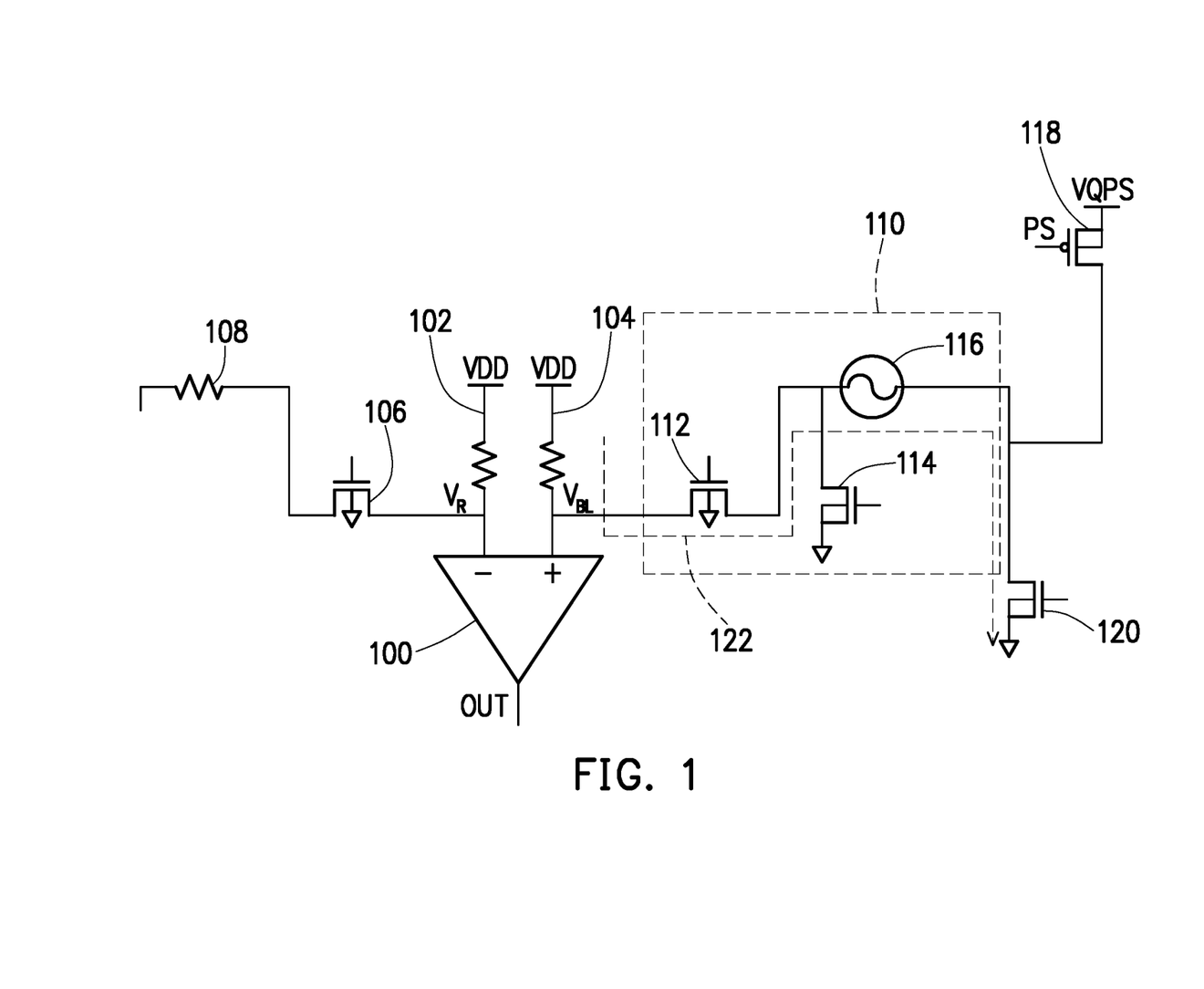
FIG. 1 is a schematic diagram of a reading mechanism of a 2T electronic fuse circuit according to an embodiment of the disclosure.

FIG. 1 is a schematic diagram of a reading mechanism of a 2T electronic fuse circuit according to an embodiment of the disclosure. With reference to FIG. 1, a more direct design of an electronic fuse circuit may adopt a two-transistor (2T) design. That is, in each electronic fuse unit 116 of an electronic fuse array 110, two transistors 112, 114 are disposed to control switching between a reading operation and a programming operation. The electronic fuse array 110 includes a plurality of electronic fuse units 116. Each of the electronic fuse units 116 represents one bit of memory. The transistor 112 is configured to control the reading operation, and the transistor 114 is configured to control the programming operation.

On the whole, the circuit includes a comparator 100 at a front end of the electronic fuse array 110, which receives a reference voltage VR and a read voltage Vim that is read on a bit line. The bit line refers to a path including the electronic fuse unit 116 and the transistor 114. A transistor 106 is turned on during the reading operation. According to a resistance value of a resistor 108 on a path 102, a fixed voltage is divided from an operation voltage VDD to the resistor 108 to obtain the reference voltage VR. That is, the reference voltage VR is generated, for example, as the voltage VR divided from the operation voltage VDD to the reference resistor 108.

The electronic fuse unit 116 is in a low resistance state when turned on, and the electronic fuse unit 116 is in a high resistance state when melted. According to a resistance value of the electronic fuse unit 116 on a path 104, a voltage is divided from the operation voltage VDD to the electronic fuse unit 116 to obtain the read voltage VBL. The comparator 100 compares the state of the read voltage Vim and determines a bit value stored in the electronic fuse unit 116.

One selected bit in the electronic fuse array 110 is under control by the turning on/off of the transistor to obtain a read path 122 according to the reading operation. The transistor 112, which may also be referred to as a read path transistor, is turned on during the reading operation, such that the comparator 100 receives the read voltage Vim on the read path 122. The read path 122 also includes the electronic fuse unit 116 connected in series and a transistor 120 for grounding. During the reading operation, the transistor 114 and a transistor 118 are turned off, namely in a non-conducting state. As such, the transistor 118 disconnects a system high voltage VQPS, and the transistor 114, before the electronic fuse unit 116, also disconnects the ground voltage.

Figure 2:
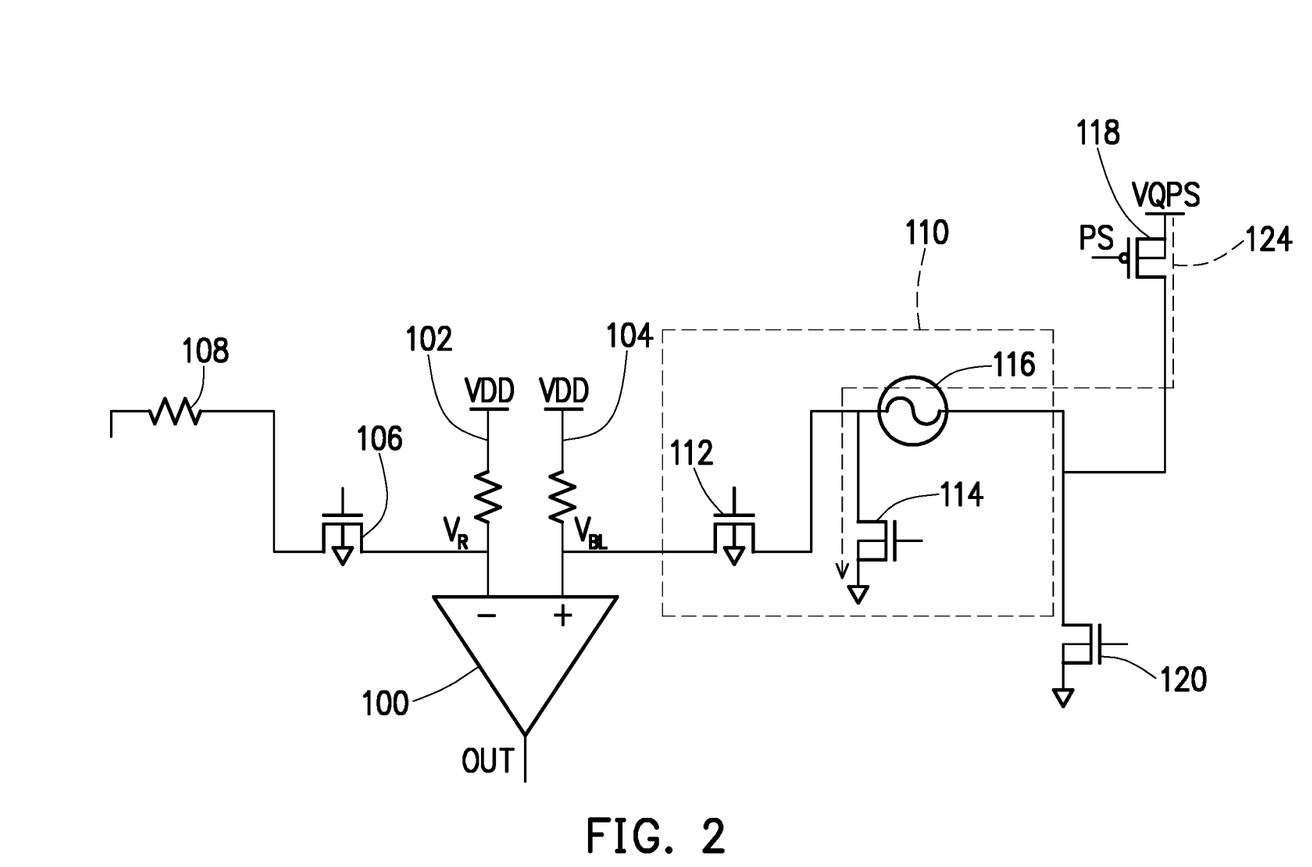
FIG. 2 is a schematic diagram of a programming mechanism of a 2T electronic fuse circuit according to an embodiment of the disclosure.

FIG. 2 is a schematic diagram of a programming mechanism of a 2T electronic fuse circuit according to an embodiment of the disclosure. With reference to FIG. 2, the programming operation will establish a programming path 124, including the transistor 114, the electronic fuse unit 116, and the transistor 118, which are connected in series to form the programming path 124. The transistor 112 and the transistor 120 are in a turned-off state. The transistor 118 is a PMOS transistor. Flowing through the electronic fuse unit 116, the system high voltage VQPS for programming melts a fuse of the electronic fuse unit 116, and the electronic fuse unit 116 turns into the high resistance state. As mentioned above, the read path senses the resistance state of the electronic fuse unit 116, such that a voltage is divided from the operation voltage VDD to the electronic fuse unit 116 to be compared to the reference voltage VR.

Herein, the read path 122 of the 2T electronic fuse circuit ensures the complete establishment of the read path 122 and the programming path 124. During the reading operation, the read path 122 effectively isolates the system high voltage VQPS, and the read voltage Vim is in a stable state and a displacement to the ground voltage will not be generated due to a leakage current. However, for the 2T electronic fuse circuit, two transistors are disposed in each of the electronic fuse units 116 of the electronic fuse array 110, occupying the original area.

Figure 3:
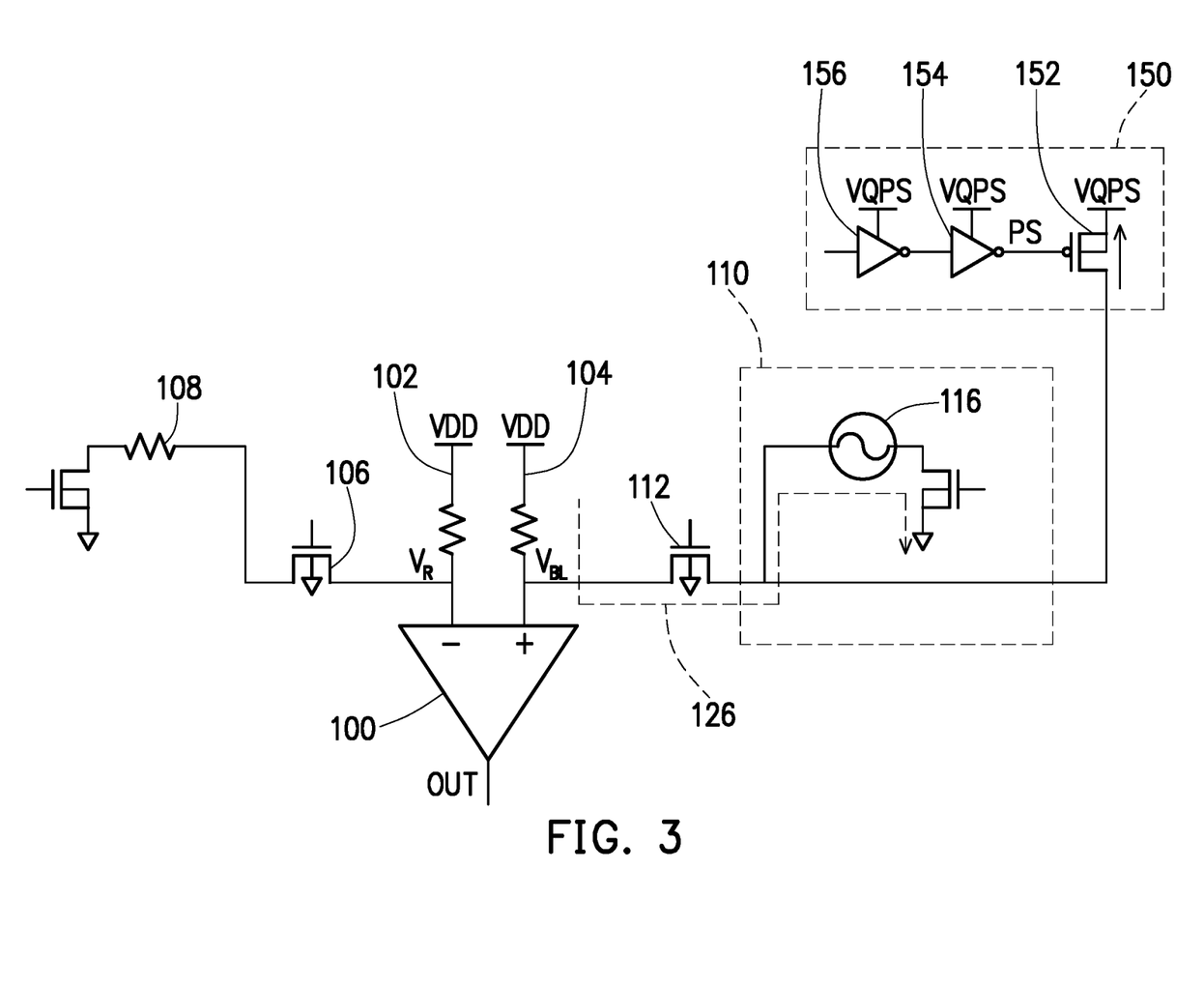
FIG. 3 is a schematic diagram of a reading mechanism of a 1T electronic fuse circuit according to an embodiment of the disclosure.

To save the device area, it may be taken into consideration that the transistor 112 may be adjusted to be shared by the electronic fuse units 116, which saves the device area. FIG. 3 is a schematic diagram of a reading mechanism of a 1T electronic fuse circuit according to an embodiment of the disclosure.

With reference to FIG. 3, the transistor 112 of the 1T electronic fuse circuit is shared. At this time, a programming voltage is provided by a power circuit 150. The electronic fuse array 110 does not include the transistor 112. The power circuit 150 includes a plurality of buffers 154 and 156, which are, for example, inverters and are under control by the system high voltage VQPS. The buffers 154 and 156 lastly provide a control voltage PS to a transistor 152. The transistor 152 is connected to the transistor 112 and the electronic fuse unit 116. The electronic fuse unit 116 is then connected to another transistor and is under control to be grounded by a read device. The read device is, for example, a transistor.

During a reading operation, a read path 126 will be established, and the comparator 100 will thus receive the read voltage VBL. However, since an output terminal of the power circuit 150 is also connected to the transistor 112, the read voltage Vim will be pulled down if the power circuit 150 gives rise to a leakage current. Under normal operation, if the electronic fuse unit 116 is melted and is in the high resistance state, the read voltage Vim is greater than the reference voltage VR.

As explored in the disclosure, since the transistor 152 is a PMOS transistor design and a bulk voltage thereof is also connected to the system high voltage VQPS, the transistor 152 may give rise to a leakage current. If the power circuit 150 gives rise to a leakage current and pulls down the read voltage Vim, this may cause a read error, as will be described in FIG. 6 later.

Figure 4:
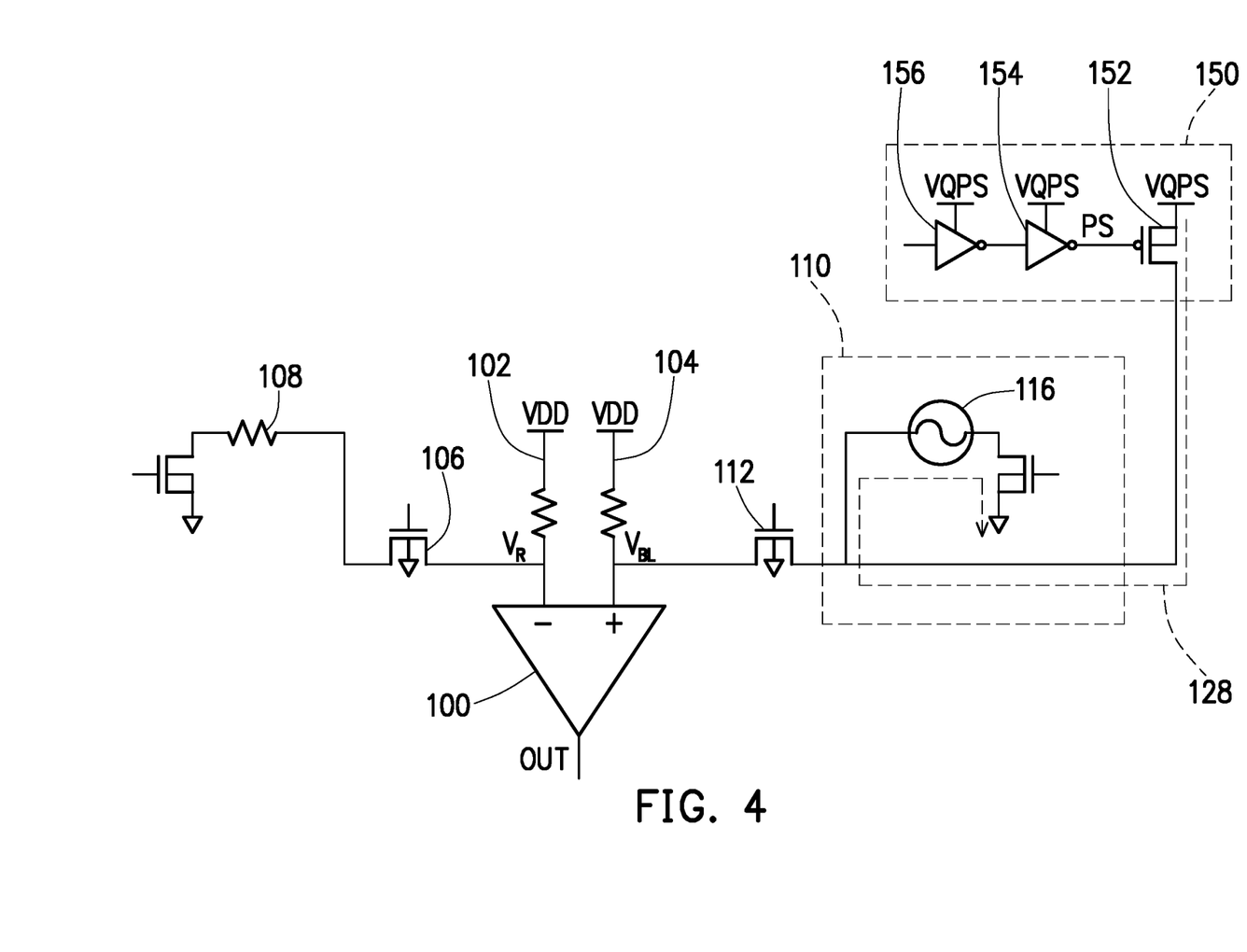
FIG. 4 is a schematic diagram of a programming mechanism of a 1T electronic fuse circuit according to an embodiment of the disclosure.

FIG. 4 is a schematic diagram of a programming mechanism of a 1T electronic fuse circuit according to an embodiment of the disclosure. With reference to FIG. 4, when a 1T electronic fuse circuit is in a programming operation, a programming path 128 is established. At this time, the transistor 112 is turned off, and the power circuit 150 provides the programming voltage, melting the fuse of the electronic fuse unit 116.

In the reading operation of FIG. 3, the transistor 112 is turned on and is shared. In the programming operation of FIG. 4, the transistor 112 is turned off and shared. Therefore, the electronic fuse array 110 of the 1T electronic fuse circuit uses only one transistor, effectively saving a device area. However, it may be that the PMOS transistor 152 of the power circuit 150 stops applying the system high voltage VQPS in the reading operation, and the loss of voltage gives rise to a leakage current that cannot be effectively turned off, affecting the read voltage Vim on the bit line during the reading operation.

Figure 5:
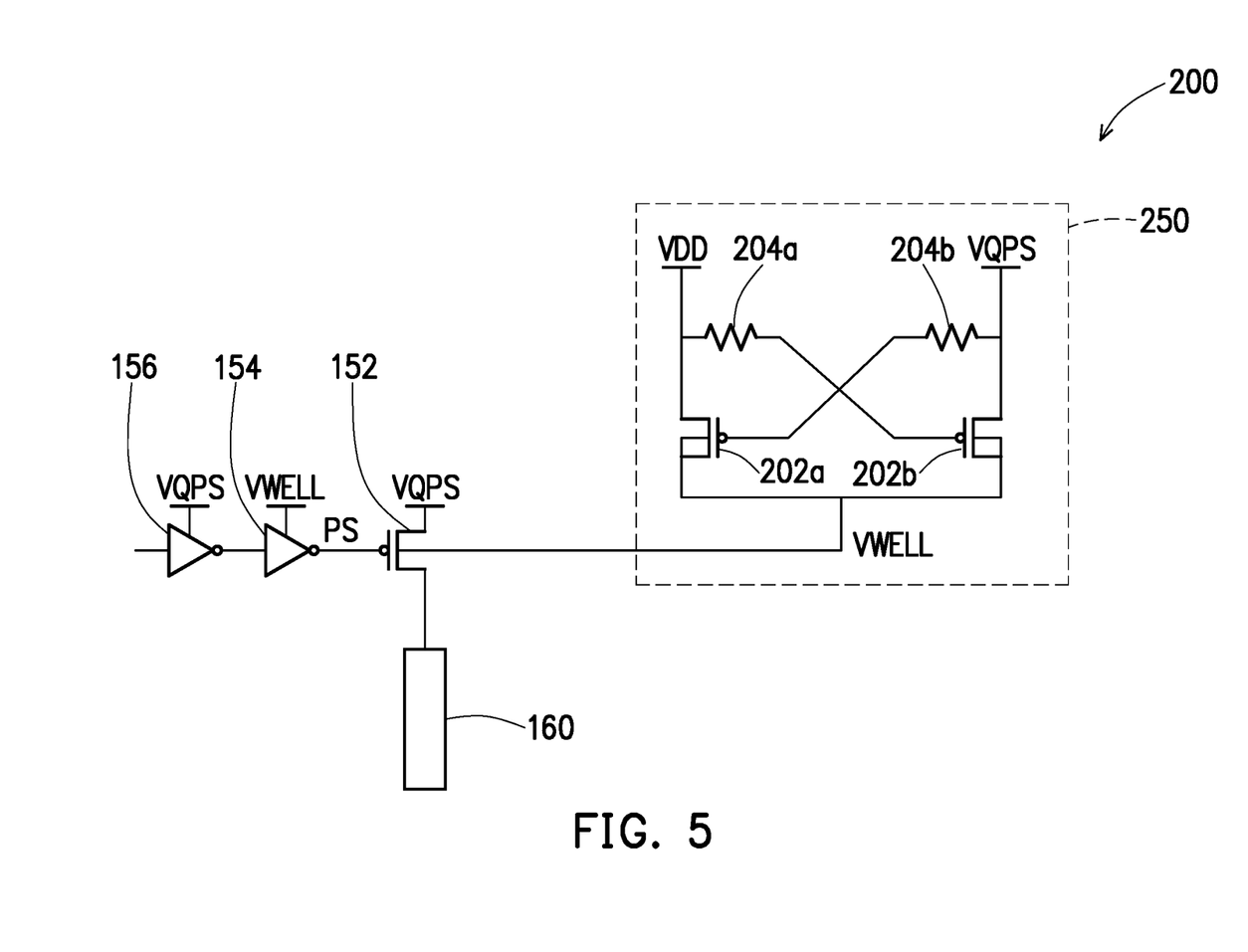
FIG. 5 is a schematic structural diagram of a power circuit of an electronic fuse circuit according to an embodiment of the disclosure.

The disclosure further proposes an improvement of the power circuit 150. FIG. 5 is a schematic structural diagram of a power circuit of an electronic fuse circuit according to an embodiment of the disclosure.

With reference to FIG. 5, in an embodiment, a power circuit 200 may replace the power circuit 150 of FIG. 3 and FIG. 4. The power circuit 200 includes, for example, the pass transistor 152 of a PMOS transistor. Compared to the transistor 152 of FIG. 3 and FIG. 4, however, the bulk voltage is provided by a bulk voltage control circuit 250.

The transistor 152 includes a bulk electrode, a gate electrode, a first source/drain electrode receiving the system high voltage VQPS, and a second source/drain electrode connected to a bit line 160. The bit line 160 is a path including the electronic fuse unit 116. Herein, the transistor 112 is also connected to the bit line 160. When turned on, the transistor 112 reads the storage state of the electronic fuse unit 116. The bulk electrode of the transistor 152 independently receives a bulk voltage VWELL provided by the bulk voltage control circuit 250. A buffer circuit includes the buffers 154 and 156, and provides the voltage PS to the gate electrode of the transistor 152. The transistor 152 is activated during a/the programming operation and turned off during a/the reading operation. As such, the bulk voltage control circuit 250 independently provides the bulk voltage VWELL to the bulk electrode of the transistor 152.

A last-stage buffer 154 of the buffer circuit is also activated by the bulk voltage VWELL to control the transistor 152 to be turned off during the reading operation of the 1T electronic fuse circuit so as to reduce the leakage current arising from the transistor 152 in the turned-off state.

In the design of the bulk voltage control circuit 250, it is expected that the operation voltage VDD is provided as the bulk voltage VWELL during the reading operation, namely when the system high voltage VQPS is 0V. At the same time, the bulk voltage VWELL serves as the activating voltage of the last-stage buffer 154, thereby ensuring that the PMOS transistor 152 maintains in a turned-off state. A voltage relationship between the operation voltage VDD, the bulk voltage VWELL, and the system high voltage VQPS is as shown in Table 1, where the operation voltage VDD is, for example, 0.8V, and the system high voltage VQPS, for example, changes between 0V and 1.8V. Therefore, the bulk voltage VWELL maintains at 0.8V when the system high voltage VQPS changes to 0V or floating.

TABLE 1

| Operation voltage VDD | System high voltage VQPS | Bulk voltage VWELL |
|---|---|---|
| 0.8 V | 0 V | 0.8 V |
| 0.8 V | 1.8 V | 1.8 V |
| 0.8 V | floating | 0.8 V |

In an embodiment, the bulk voltage control circuit 250 includes, for example, a first PMOS transistor 202a, a second PMOS transistor 202b, a first resistor 204a, and a second resistor 204b. Herein, the first resistor 204a and the second resistor 204b may prevent electrostatic discharge. However, if the circuit providing the system high voltage VQPS already has electrostatic discharge protection, then the first resistor 204a and the second resistor 204b may be omitted.

The first PMOS transistor 202a includes a first source electrode connected to the operation voltage VDD, a first drain electrode connected to an output node to provide the bulk voltage VWELL, and a first gate electrode. The second PMOS transistor 202b includes a second source electrode connected to the system high voltage VQPS, a second drain electrode connected to the output node to provide the bulk voltage VWELL, and a second gate electrode. The first resistor 204a is connected between the operation voltage VDD and the second gate electrode of the second PMOS transistor 202b. The second resistor 204b is connected between the system high voltage VQPS and the first gate electrode of the first PMOS transistor 202a.

If the electrostatic discharge protection is not required, the first resistor 204a and the second resistor 204b may be omitted. As such, the first gate electrode of the first PMOS transistor 202a is directly connected to the system high voltage VQPS, and the second gate electrode of the second PMOS transistor 202b is directly connected to the operation voltage VDD.

Figure 6:
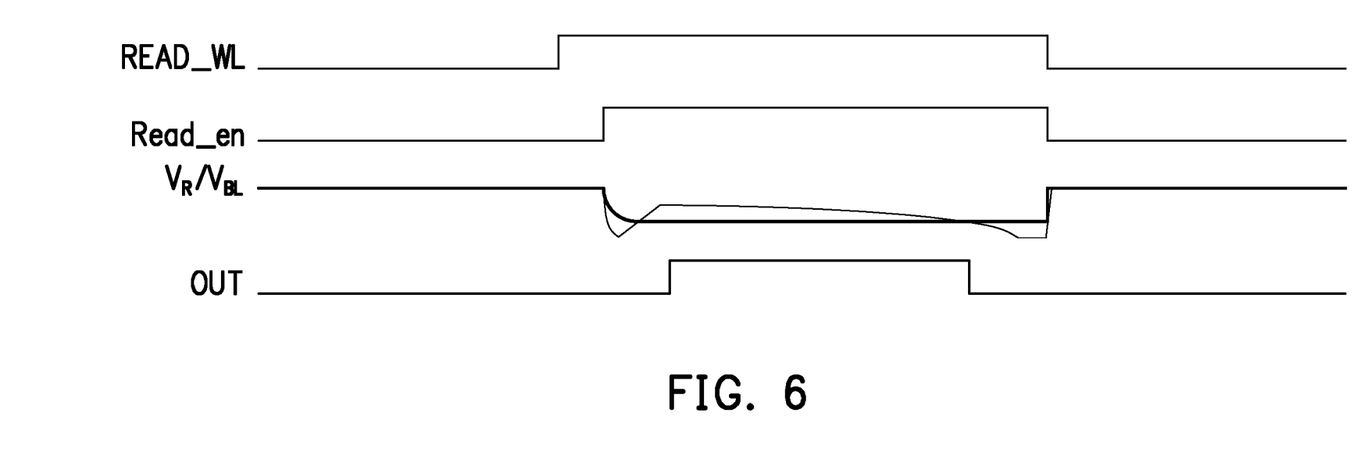
FIG. 6 is a schematic diagram of a signal waveform of a possible reading failure by the electronic fuse circuit of FIG. 3 according to an embodiment of the disclosure.

Hereinafter, a relationship between signal waveforms will be described. FIG. 6 is a schematic diagram of a signal waveform of a possible reading failure by the electronic fuse circuit of FIG. 3 according to an embodiment of the disclosure. With reference to FIG. 6, if the 1T electronic fuse circuit of FIG. 3 is adopted, the power circuit 150 thereof may give rise to a leakage current and pull down the read voltage VBL.

With reference to FIG. 3 and FIG. 6, a signal READ_WL shows a read activation cycle. A signal READ_en represents the turned-on transistors 106 and 112. The reference voltage signal VR is represented with a thick line. The read voltage signal Vim is represented with a thin line. An output signal OUT of the comparator represents the comparison state between the reference voltage signal VR and the read voltage signal VBL. In an initial stage, the read voltage signal Vim is unstable and may be avoided. For example, when the read voltage signal VIM is greater than the reference voltage signal VR, the output signal OUT is "1", and when the read voltage signal Vim is less than or equal to the reference voltage signal VR, the output signal OUT is "0". Since the PMOS transistor of the power circuit 150 may give rise to a leakage current and be in a turned-on state, causing the read voltage signal VIM to decrease and be less than the reference voltage signal VR, the output signal OUT may change from "1" to "0".

Figure 7:
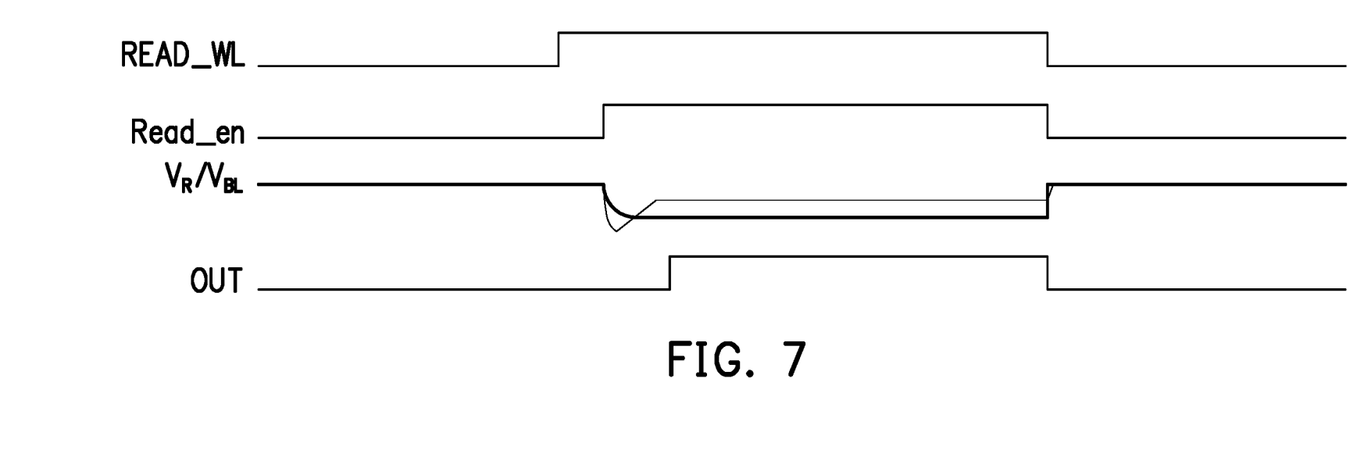
FIG. 7 is a schematic diagram of a signal waveform of an ensured reading success by the power circuit of FIG. 5 added into a 1T electronic fuse circuit according to an embodiment of the disclosure.

FIG. 7 is a schematic diagram of a signal waveform of an ensured reading success by the power circuit of FIG. 5 added into a 1T electronic fuse circuit according to an embodiment of the disclosure. With reference to FIG. 5, FIG. 7, and part of FIG. 3, since the power circuit 200 is added with the bulk voltage control circuit 250 to control the PMOS transistor 152 and the last-stage buffer 154, it effectively ensures that the PMOS transistor 152 is turned off during the reading operation, reducing an occurrence of a leakage current. As such, the output signal OUT maintains in a state of outputting "1".

The power circuit 200 of the disclosure ensures that a high voltage is output. The power circuit 200 may be applied to the 1T electronic fuse circuit to reduce a leakage current of the PMOS transistor 152 during the reading operation.

In the disclosure, a method for providing power to an electronic fuse circuit is provided. The method includes providing a pass transistor of a PMOS transistor that includes a bulk electrode, a gate electrode, a first source/drain electrode receiving a system high voltage, and a second source/drain electrode connected to a bit line. The method further includes providing a buffer circuit to provide a control voltage to the gate electrode of the pass transistor, where the pass transistor is turned on during a programming operation and turned off during a reading operation. This method also includes providing a bulk voltage control circuit to independently provide a bulk voltage to the bulk electrode. A last-stage buffer of the buffer circuit is also activated by the bulk voltage to control the pass transistor during the reading operation of the electronic fuse circuit.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. An electronic fuse circuit comprising:
an electronic fuse array;
a comparator, a first input terminal of the comparator receives a reference voltage, a second input terminal of the comparator is connected to the electronic fuse array, wherein the comparator determines a bit value stored in the electronic fuse array; and
a power circuit, connected to the electronic fuse array, comprising:
a pass transistor of a P-type metal-oxide-semiconductor comprising a bulk electrode, a gate electrode, a source electrode receiving a system high voltage, and a drain electrode connected to a bit line;
a bulk voltage control circuit independently providing a bulk voltage to the bulk electrode; and
a buffer circuit connected to the gate electrode of the pass transistor,
wherein a last-stage buffer of the buffer circuit is activated by the bulk voltage to control the pass transistor,
wherein the bulk voltage control circuit comprises:
a first P-type metal-oxide-semiconductor transistor comprising a first source electrode connected to an operation voltage, a first drain electrode connected to an output node, and a first gate electrode connected to the system high voltage; and
a second P-type metal-oxide-semiconductor transistor comprising a second source electrode connected to the system high voltage, a second drain electrode connected to the output node for providing the bulk voltage, and a second gate electrode connected to the operation voltage.

2. The electronic fuse circuit of claim 1,
wherein the pass transistor is turned on during a programming operation and turned off during a reading operation, and
wherein the last-stage buffer of the buffer circuit is activated by the bulk voltage to control the pass transistor during the reading operation of the electronic fuse circuit.

3. The electronic fuse circuit of claim 1,
wherein the first gate electrode is directly connected to the system high voltage, and
wherein the second gate electrode is directly connected to the operation voltage.

4. The electronic fuse circuit of claim 1,
wherein the bulk voltage of the bulk voltage control circuit is the operation voltage when the system high voltage is changed into a low voltage or a floating voltage, and
wherein the bulk voltage of the bulk voltage control circuit is the system high voltage when the system high voltage is higher than the operation voltage.

5. The electronic fuse circuit of claim 1, wherein the buffer circuit comprises a front-stage buffer and the last-stage buffer,
wherein the front-stage buffer is under control by the system high voltage and the last-stage buffer is under control by the bulk voltage, and an output terminal of the front-stage buffer is connected to an input terminal of the last-stage buffer.

6. The electronic fuse circuit of claim 1, wherein the electronic fuse circuit comprises:
a read path transistor comprising a source electrode receiving an operation voltage, a gate electrode under control by a read enable signal, and a drain electrode connected to the power circuit; and
an electronic fuse array comprising a plurality of electronic fuse units, wherein each of the electronic fuse units is commonly connected to the drain electrode of the read path transistor.

7. The electronic fuse circuit of claim 6, wherein the drain electrode of the pass transistor is connected to the drain electrode of the read path transistor.

8. The electronic fuse circuit of claim 6, wherein each of the electronic fuse units comprises:
a fuse device connected to the drain electrode of the read path transistor; and a read device connected between the fuse device and a ground voltage, wherein the read device is under control to be connected to or disconnected from the ground voltage.

9. The electronic fuse circuit of claim 6, wherein the read path transistor and the pass transistor of the power circuit are respectively turned on corresponding to the reading operation and the programming operation.

10. A method for an electronic fuse circuit, the method comprising:
providing a pass transistor of a P-type metal-oxide-semiconductor comprising a bulk electrode, a gate electrode, a source electrode receiving a system high voltage, and a drain electrode connected to a bit line;
providing a buffer circuit to provide a control voltage to the gate electrode of the pass transistor, turning on the pass transistor during a programming operation and turning off the pass transistor during a reading operation;
providing a bulk voltage control circuit independently providing a bulk voltage to the bulk electrode;
providing an electronic fuse array, wherein the electronic fuse array is connected to the pass transistor; and
determining a bit value stored in the electronic fuse array, wherein a last-stage buffer of the buffer circuit is activated by the bulk voltage to control the pass transistor during the reading operation of the electronic fuse circuit,
wherein the bulk voltage control circuit as provided comprises:
a first P-type metal-oxide-semiconductor transistor comprising a first source electrode connected to an operation voltage, a first drain electrode connected to an output node, and a first gate electrode connected to the system high voltage; and
a second P-type metal-oxide-semiconductor transistor comprising a second source electrode connected to the system high voltage, a second drain electrode connected to the output node for providing the bulk voltage, and a second gate electrode connected to the operation voltage.

11. The method of claim 10, wherein the bulk voltage control circuit as provided receives an operation voltage and the system high voltage for the pass transistor, to ensure that the bulk voltage is the operation voltage, or that the bulk voltage is the system high voltage when the system high voltage is higher than the operation voltage.

12. The method of claim 10,
wherein the first gate electrode is directly connected to the system high voltage, and
wherein the second gate electrode is directly connected to the operation voltage.

13. The method of claim 10,
wherein the bulk voltage of the bulk voltage control circuit is the operation voltage when the system high voltage is changed into a low voltage or a floating voltage, and
wherein the bulk voltage of the bulk voltage control circuit is the system high voltage when the system high voltage is higher than the operation voltage.

14. The method of claim 10, wherein the buffer circuit as provided comprises a front-stage buffer and the last-stage buffer,
wherein the front-stage buffer is under control by the system high voltage and the last-stage buffer is under control by the bulk voltage, and an output terminal of the front-stage buffer is connected to an input terminal of the last-stage buffer.

15. The method of claim 10, wherein the electronic fuse circuit comprises:
a read path transistor comprising a source electrode receiving an operation voltage, a gate electrode under control by a read enable signal, and a drain electrode connected to the drain electrode of the pass transistor; and
an electronic fuse array comprising a plurality of electronic fuse units, wherein each of the electronic fuse units is commonly connected to the drain electrode of the read path transistor.

16. The method of claim 15, wherein the step of turning on the pass transistor during the reading programming operation comprises:
turning on the read path transistor and turning off the pass transistor during the programming operation.

17. The method of claim 15, wherein the step of turning off the pass transistor during the programming operation comprises:
turning on the pass transistor and turning off the read path transistor during the reading operation.

* * * * *